Figure 1:
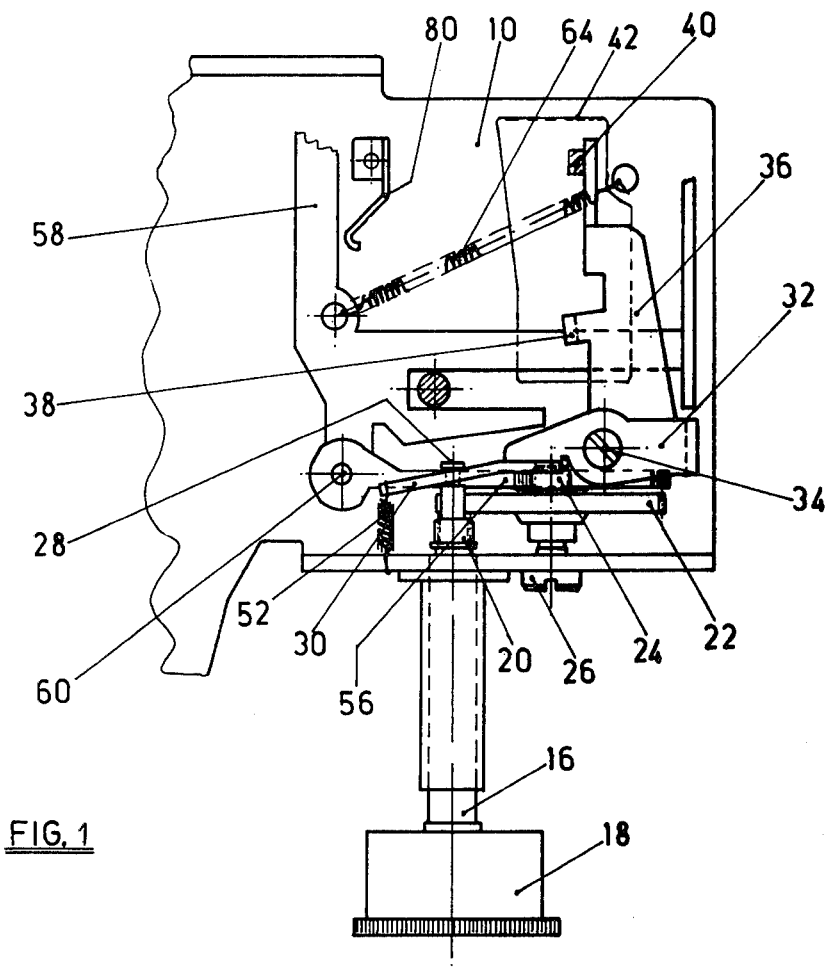

United States Patent [19]

Dellantonio

[11] 4,308,757

[45] Jan. 5, 1982

[54] CLUTCH DEVICE, PARTICULARLY FOR THE MANUAL TUNING CONTROL IN A CAR RADIO

[75] Inventor: Ezio F. Dellantonio, Rome, Italy

[73] Assignee: Autovox S.p.A., Rome, Italy

[21] Appl. No.: 133,175

[22] Filed: Mar. 24, 1980

[30] Foreign Application Priority Data

Mar. 30, 1979 [IT] Italy .................................. 48564 A/79

[51] Int. Cl.³ .................................................. H03J 5/12
[52] U.S. Cl. ........................................ 74/10.8; 74/10.33; 74/89.17
[58] Field of Search .................. 74/10.33, 10.37, 10.8, 74/89.17; 334/7

[56] References Cited

U.S. PATENT DOCUMENTS

| | | | |
|---|---|---|---|
| 4,120,207 | 10/1978 | Dellantonio | 74/10.33 |
| 4,194,403 | 3/1980 | Santoro | 74/10.33 |
| 4,226,128 | 10/1980 | Dellantonio | 74/10.33 X |
| 4,232,560 | 11/1980 | Dellantonio | 74/10.33 |

*Primary Examiner*—Allan D. Herrmann
*Attorney, Agent, or Firm*—Ladas & Parry

[57] ABSTRACT

A clutch device, particularly for the manual tuning control in a car radio, has the function of positively transmitting, through rack and pinion gears, movement from the tuning knob to the tuning runner. The clutch device comprises a rotating shaft (16) axially reciprocable with respect to frame (10) between an extracted position and an inserted position, with a knob (18) integral with said shaft. Shaft 16 carries a spur gear (20) at its other end, which in the inserted position of the shaft (16) with respect to frame (10) engages a gear wheel (22) integral with a pinion (24) which, cooperating with a rack (56) connected to the usual tuning runner (58) forms a rack and pinion device for positively transmitting movement. A bridge (32) having two arms (30) and (36) engages a tie bar (12), the function of which is to maintain in its operative position one of the preset keys which has been pushed in order to tune in on a station, and this occurs when said shaft (16) is in its inserted position; there is, furthermore, an elbow lever (44) which keeps the shaft (16) in its inserted position and is controllable through the usual slider (14) controlling the disengagement of the tuning knob clutch device.

8 Claims, 6 Drawing Figures

CLUTCH DEVICE, PARTICULARLY FOR THE MANUAL TUNING CONTROL IN A CAR RADIO

This invention relates to a clutch device, particularly for the manual tuning control in a car radio.

In car radios having a tuning memory system, in which a plurality of keys allows to automatically tune in on a certain number of preset stations, a device must be provided which permits use of a manual tuning control knob in order to tune in on stations independently of the keys and/or to preset stations which may be tuned in through the keys.

This manual control device must be disengaged when any preset key is operating and must be engaged for manual control.

Generally, this device is built based on friction systems, as described, for example, in the copending patent application Ser. No. 896,122 of Apr. 13, 1978, assigned to the same assignee.

These types of known device, however, present the following disadvantages:
 the transmission ratio is not constant, due to coupling slippages;
 forces involved in transmitting the required torque are extremely high;
 there is elasticity in the transmission, and therefore precision is poor where high coefficient of friction materials are used;
 technological production of the clutch coupling parts is difficult.

It is the main object of the device of this invention to eliminate the disadvantages described above through reliable kinematic solutions, which are of generally small size and which have a low manufacturing cost.

In accordance with the invention, a clutch device, particularly for he manual tuning control in a car radio provided with a key operated tuning memory system in which a tie bar has the function of keeping any preset key, pressed to tune in on a station, in its operative position and in which a control slider for disengaging the knob tuning device has the function of disengaging the knob tuning device when a preset tuning key is operating, comprises: a rotatable shaft, axially reciprocable with respect to the frame, between an extracted position and an inserted position; a knob integral with said shaft; a spur gear integral with said shaft; a gear wheel pivoted in the frame and engaged by said spur gear in the inserted position of said shaft; a pinion integral with said gear wheel; a rack in engagement with said pinion and coupled to the usual tuning runner of the car radio; means for engaging said tie bar when said shaft is in its inserted position; and holding means for keeping said shaft in its inserted positon, said holding means being releasable by said slider. The main advantage of this invention therefore consists in the positive transmission of movement, in other words in positive control from the knob to the movable tuning element, obtained through rack and pinion arrangement.

Another advantage is that the tuning knob is bistable, in other words it has two well defined positions: an extracted position which corresponds to the disengagement of the control and an inserted position which corresponds to the engagement of the control.

Automatic return to the disengaged position occurs when a preset key on the keyboard is pressed.

Figure 4:
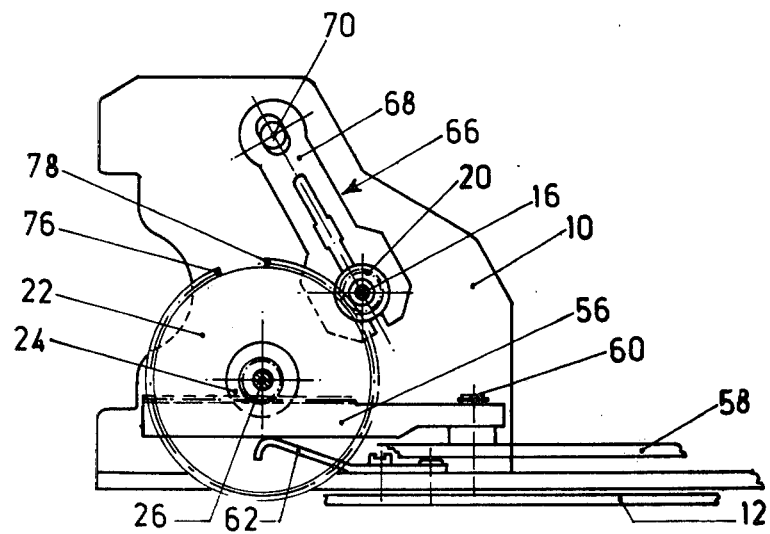
Figure 2:
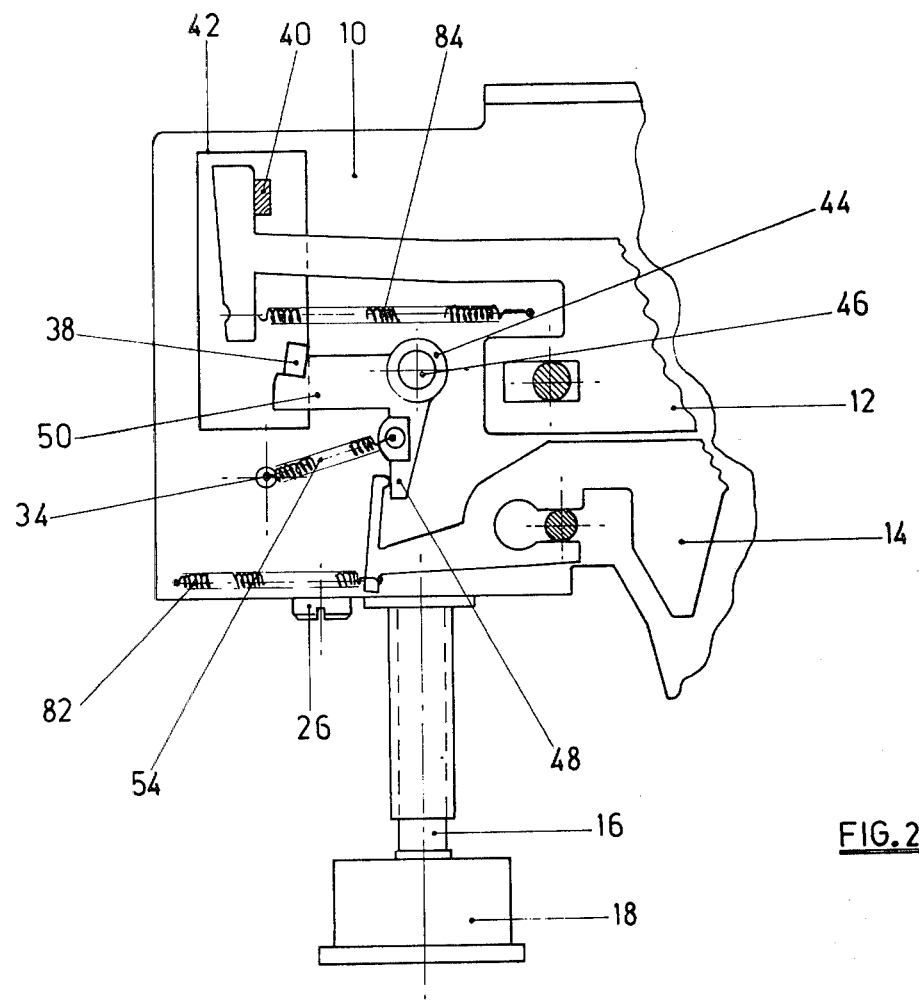
Figure 5:
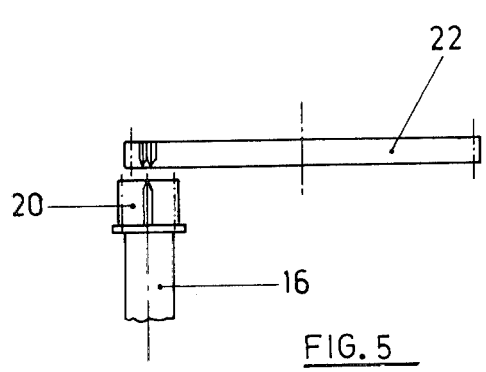
Figure 6:
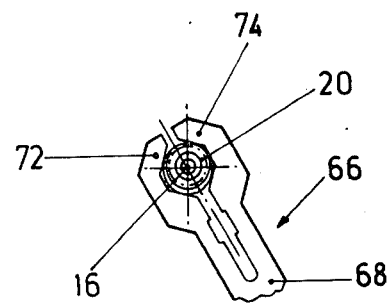
Figure 3:
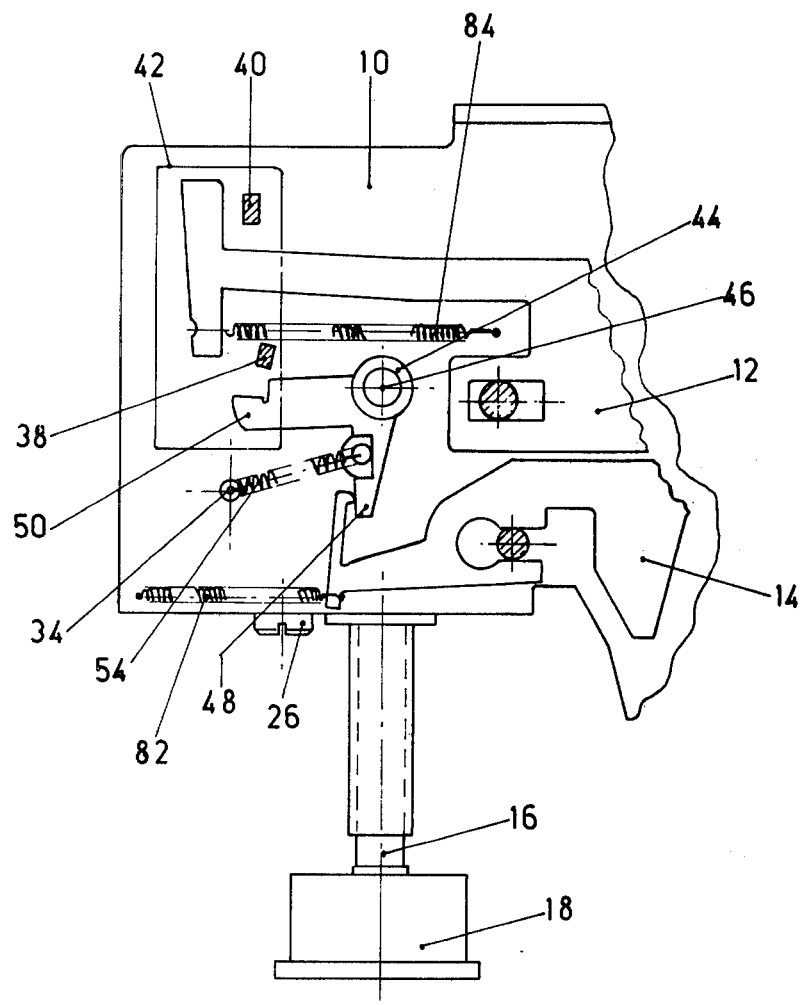

A clutch device according to the present invention will now be described by way of example, and not in any limiting sense, with reference to the accompanying drawings, in which:

FIG. 1 is a top play view of the device according to the invention;
FIG. 2 is a bottom plan view of the device in its engaged position;
FIG. 3 is a bottom plan view of the device in its disengaged position;
FIG. 4 is a rear elevation view of the device;
FIG. 5 shows a detail of the clutch gears; and
FIG. 6 shows a detail of the brake.

With reference to the drawings, the device is placed on a frame 10 of a car radio provided with a tuning memory system, operated through keys not shown, of the type, for example, described in the copending patent application Ser. No. 849,739 of Nov. 9, 1977 now U.S. Pat. No. 4,232,560, assigned to the same assignee.

Such key tuning memory system comprises a tie bar 12 having the function of keeping a preset key, which has been pressed to tune in on a desired preset station, in its operative or pressed-in position. A control slider 14 for disengaging the knob tuning device, having the function of disengaging the knob tuning device when a preset tuning key is pressed, is also provided.

The device according to the invention comprises a tuning shaft 16, supported by frame 10, and to which a tuning knob 18 is integral with, serving as manual control member. Shaft 16 is axially reciprocable and may assume two stable positions, one extracted position and one inserted position with respect to the car radio.

A spur gear 20, also integral with shaft 16, is engageable, in the inserted position of shaft 16, with a gear wheel 22, integral with a pinion 24 and rotatable around a pivot 26 integral with frame 10. The front engagement between spur gear 20 and gear wheel 22 is helped by the special wedge shape profile of the two gears, as more clearly illustrated in FIG. 5.

End 28 of tuning shaft 16 is axially tied to an arm 30 of a bridge 32 fulcrumed in 34 on frame 10. This way the axial movement of shaft 16 towards the inside of the keyboard forces bridge 32 to rotate in a clockwise direction as viewed in FIG. 1 and viceversa in the case of an axial movement of shaft 16 towards the outside of the car radio.

Bridge 32 is provided with a second arm 36 having two appendixes 38 and 40 which go through frame 10 through an appropriate opening 42.

Appendix 40 has the function of engaging tie bar 12 in order to free a key which may be in its operative position, when knob 18 is pressed, as best shown in FIG. 2.

An elbow lever 44, engaged around a pivot 46 integral with frame 10, has two arms 48 and 50.

Arm 50 has the function of engaging appendix 38 of arm 36 of bridge 32, preventing it from rotating in a counterclockwise direction, as viewed in FIG. 1, as would happen under the biasing action of a spring 52 shown in FIG. 1.

Arm 48 is engaged by slider 14 and caused to rotate in a counterclockwise direction as viewed in FIG. 3, against the action of a traction spring 54, every time a preset tuning key is pressed, as more clearly illustrated in the cited copending patent application Ser. No. 849,739, now U.S. Pat. No. 4,232,560.

During operation, when it is desired to tune in on a station through knob 18, the latter is pushed in. This way, tuning shaft 16 is axially moved towards its inserted position shown in FIG. 2, in which position the device according to the invention is in engagement and spur gear 20 is engaged with gear wheel 22. Tie bar 12 is moved, through appendix 40, thus releasing a key which may eventually be in its operative tuning position.

Elbow lever 44 keeps the device in the engaged position, in which the movement manually imparted to knob 18 is transferred, through pinion 24, to a rack 56 coupled to the usual tuning runner 58 by means of a pivot 60. A leaf spring 62 forces rack 56 in a no play contact with pinion 24.

Tuning runner 58, as usual, is retrieved back to a preferential position by a traction spring 64, which has the function of taking up all the play in the transmission chain up to pinion 24.

This yields the advantage of having a zero tuning "play" and therefore practically no uncertainty in the reverse control from the knob.

A brake 66, more clearly shown in FIG. 6, prevents spring 64 from allowing tuning shaft 16 to turn.

Brake 66 is made of a beryllium copper or phosphor bronze spring 68 engageable on frame 10 around a pivot 70. Spring 68, through its elastic terminals 72 and 74, wraps around tuning shaft 16, which is of carbon ammonia hardened or tempered steel and which therefore has a hardened surface, gripping it with sufficient strength to generate the desired stopping torque.

In this way the advantage is obtained whereby the necessary breaking applied to the tuning knob is achieved through use of a single element acting on the tuning shaft itself.

When tuning runner 58 reaches its two stroke limiters, spur gear 20 disengages one of the two ends 76 and 78 of gear wheel 22 toothing, as shown in FIG. 4. This avoids breaking of the transmission in case the knob is forced in the attempt to exceed the tuning range.

Re-engagement of spur gear 20 with gear wheel 22 toothing is assured, when the knob rotation is reversed, in a first rotational direction, by spring 64 acting on the tuning runner and, in the other direction of rotation, by a spring leaf 80 which always acts on the tuning runner in correspondence of a stroke limiter.

This way an end of stroke signalling is also obtained, i.e. a repeated disengagement sound warns the user that tuning range limit in either direction has been reached.

In order to disengage the knob tuning device, according to the invention, it is sufficient to press anyone of the preset tuning keys.

In fact, pressing the preset key in, causes slider 14 to move towards the right as viewed in FIG. 3, against the action of traction spring 82. Slider 14 forces elbow lever 44 to rotate in a counterclockwise direction, so as to free bridge 32, which, under the action of its own spring 52, moves shaft 16 to its extracted position, thus causing the disengagement of spur gear 20 from gear wheel 22.

At the same time, tie bar 12, released from appendix 40, is moved towards the right, as viewed in FIG. 3, by its spring 84. In this position tie bar 12 keeps the preset key, which had been pressed by the user to tune in on a preset station, in the inserted or operative position, and thus the station stays tuned in.

It is obvious that various variations and modifications may be brought to the invention described hereinbefore by those skilled in the art without departing from the spirit thereof; it is intended that all such variations fall within the scope of the invention.

What is claimed is:

1. A clutch device, particularly for the manual tuning control in a car radio provided with a key operated tuning memory system, in which a tie bar has the function of keeping any preset keys, pressed to tune in on a station, in its operative position, and in which a control slider for disengaging the knob tuning device has the function of disengaging the knob tuning device when a preset tuning key is operating, comprising:

a rotatable shaft, axially reciprocable with respect to the frame, between an extracted position and an inserted position; a knob integral with said shaft; a spur gear integral with said shaft; a gear wheel pivoted on the frame and engaged by said spur gear in the inserted position of said shaft; a pinion integral with said gear wheel; a rack in engagement with said pinion and coupled to the usual tuning runner of the car radio; means for engaging said tie bar when said shaft is in its inserted position; and holding means for keeping said shaft in its inserted position, said holding means being releasable by said slider.

2. A clutch device according to claim 1, wherein said means for engagement of said tie bar comprise a bridge provided with two arms, one of which is engaged axially by said shaft, while the other is provided with an appendix which cooperates with said tie bar.

3. A clutch device according to calim 2, wherein said holding means comprise an elbow lever, having a first arm which cooperates with a second appendix of said bridge for keeping it in the operative position of said shaft, and a second arm which may be biased by said slider for disengagement of said bridge.

4. A clutch device according to claim 1, wherein a leaf spring is provided which elastically forces said rack into contact with said pinion.

5. A clutch device according to claim 1, wherein said gear wheel has an interruption of its teeth in coincidence with tuning range limiters.

6. A clutch device according to claim 5, wherein a leaf spring is provided which acts on said tuning runner as stroke limiter to aid in re-engagement of the spur gear with the teeth of the said gear wheel.

7. A clutch device according to claim 1, wherein the teeth of said spur gear and said gear wheel are provided with a wedge shaped profile.

8. A clutch device according to claim 1, wherein a brake is further provided, formed by a fork shaped spring which wraps around said shaft and is held down on the frame.

* * * * *